United States Patent [19]

Basavanhally et al.

[11] Patent Number: 5,225,966
[45] Date of Patent: Jul. 6, 1993

[54] CONDUCTIVE ADHESIVE FILM TECHNIQUES

[75] Inventors: Nagesh R. Basavanhally, Trenton; Benjamin H. Cranston, Princeton, both of N.J.

[73] Assignee: AT&T Bell Laboratories, Murray Hill, N.J.

[21] Appl. No.: 735,231

[22] Filed: Jul. 24, 1991

[51] Int. Cl.⁵ .......................... H01R 9/09; H01R 4/58
[52] U.S. Cl. ..................................... 361/406; 174/259; 361/400; 361/405; 361/408; 361/412; 361/414; 361/411
[58] Field of Search ............... 361/400, 403, 411, 414, 361/405, 406, 408, 412; 174/259; 29/830, 832, 840–844, 854, 857, 860, 861, 876, 881, 882; 156/306.6, 310, 902; 439/66, 77, 91, 74

[56] References Cited

U.S. PATENT DOCUMENTS

| | | | |
|---|---|---|---|
| 3,128,544 | 4/1964 | Allingham | 439/91 |
| 3,795,047 | 3/1974 | Abolafia et al. | 361/412 |
| 3,990,142 | 11/1976 | Weglin | 174/259 |
| 4,075,420 | 2/1978 | Walton | 174/259 |
| 4,157,932 | 6/1979 | Hirata | 174/259 X |
| 4,201,435 | 5/1980 | Nakamura et al. | 339/59 M |
| 4,292,261 | 9/1981 | Kotani et al. | 264/24 |
| 4,729,809 | 3/1988 | Dery et al. | 439/91 |
| 4,740,657 | 4/1988 | Tsukagoshi et al. | 439/91 |
| 4,778,635 | 10/1988 | Hechtman et al. | 264/24 |
| 4,813,129 | 3/1989 | Karnezos | 439/74 |
| 4,814,040 | 3/1989 | Ozawa | 156/902 X |
| 4,902,857 | 2/1990 | Cranston et al. | 174/94 R |
| 5,058,800 | 10/1991 | Yoshizawa et al. | 439/91 |
| 5,068,714 | 11/1991 | Seipler | 361/400 X |

FOREIGN PATENT DOCUMENTS

| | | | |
|---|---|---|---|
| 2643753 | 8/1990 | France | 439/66 |
| 2-154499 | 6/1990 | Japan | 361/424 |
| 2-306558 | 12/1990 | Japan | 439/91 |
| 2068645 | 8/1981 | United Kingdom | 439/77 |
| 2170365 | 7/1986 | United Kingdom | 439/66 |

OTHER PUBLICATIONS

IBM Disclosure Bulletin "Direct Chip Bonding With Bump On Substrate" vol. 32 No. 10 B Mar. 1990.
IBM Disclosure Bulletin "Copper Ball Standoff For Surface-Mounted Attachment of MLC Substrates On Laminates" vol. 29 No. 4 Sep. 1986.
IBM Disclosure Bulletin "Elastomer Module-to-Board Connector System" vol. 28 No. 3 Aug. 1985.
"Packaging Ideas," edited by Howard Markstein, Electronic Packaging & Production, Oct. 1990, p. 47.

Primary Examiner—Leo P. Picard
Assistant Examiner—Donald A. Sparks
Attorney, Agent, or Firm—Roderick B. Anderson

[57] ABSTRACT

A compliant element (23, 25) is provided between an integrated circuit (11) and a substrate (19) which are bonded and interconnected by an anisotropic conductive adhesive (20) comprising conductive particles (21) in a polymer matrix (22). In one embodiment, one set of bonding pads (12, FIG. 2) is coated with a layer (23) of a metal that is significantly softer than the metal from which the conductive particles are made, which permits an oversized conductive particle (21a) to indent into the soft metal layer (23). In another embodiment, one of the sets of bonding pads (15, FIG. 3) is arranged on a relatively thick layer of adhesive (25) which is sufficiently viscous at the temperature at which contact is made to permit the bonding pad (15) to pivot in response to pressure from an oversized conductive particle (21d).

12 Claims, 1 Drawing Sheet

CONDUCTIVE ADHESIVE FILM TECHNIQUES

TECHNICAL FIELD

This invention relates to techniques for making electrical interconnections to electronic devices and, more particularly, to such methods which use conductive adhesives for bonding an electronic device to a substrate and for providing electrical interconnection between the device and the substrate.

BACKGROUND OF THE INVENTION

Considerable work has been expended in improving techniques for bonding integrated circuit chips to conductive circuit patterns supported on a substrate. One such method uses an anisotropically conductive adhesive between bonding pads on the substrate and matching bonding pads of the integrated circuit chip. The adhesive is typically an insulative polymer containing conductive particles that simultaneously contact the pad of the chip and the pad of the substrate to provide interconnection. The conductive particles do not provide any significant lateral or horizontal conduction; they transmit current only in the vertical direction between substrate and device bonding pads, and so the conduction is referred to as "anisotropic." The adhesive of the polymer is cured after mounting of the chip on the substrate which thereafter provides a permanent structural bond in addition to a conductive interconnection. High component density and bonding pad densities can be accommodated by conductive adhesives, and their use generally reduces assembly costs.

Anisotropic conductive adhesives are particularly promising for reducing the cost of bonding chips having a high density of bonding pads spaced only a very small distance from the bonding pads of the substrate. For example, if they could be used for interconnecting bonding pads spaced only about fifteen microns from substrate bonding pads, with the dimensions of the bonding pads being on the order of only one hundred microns on a side, assembly costs could be considerably reduced compared to other methods, and the losses due to inductance through the connections could be reduced because of the close spacing. Unfortunately, commercially available conductive particles do not have dependably uniform dimensions, and as a result a large-diameter particle may separate matching bonding pads so as to prevent other particles from making conductive interconnections. The occasional large-diameter particle may even prevent adjacent bonding pads from being interconnected which could result in a catastrophic malfunction of an entire system. Additionally, deviations from planarity of the substrate surface may prevent good contact via certain ones of the particles.

The U.S. patent of Tsakagoshi et al., U.S. Pat. No. 4,754,657, granted Apr. 26, 1988, addresses this problem and solves it by providing metal coated polymer balls as the conductive particles. With the metal coating being sufficiently thin, a large-diameter polymer ball will deform under pressure so as to permit contact to be made simultaneously with smaller diameter balls. We have found that a major problem with this technique is that such conductive interconnects are inherently current limited. That is, for the balls to be appropriately deformable, the metal coating on each ball must be appropriately thin, and such thin coatings are incapable of transmitting relatively high current densities. If the conductive coatings on the polymer balls are made thick enough to conduct high current densities, we have found that they prevent deformation of the ball, and the technique for ensuring reliability does not work. The thin coatings are also more inductive than solid metal particles, which reduces the speed at which the interconnected circuits can be operated.

Accordingly, there has been a long-felt need for conductive adhesive techniques that can provide reliable conduction and bonding, and particularly for such techniques that are consistent with relatively high current densities and/or low inductance.

SUMMARY OF THE INVENTION

The invention is an improvement of a conductive adhesive technique for bonding a plurality of bonding pads of an integrated circuit chip to matching bonding pads of a conductive pattern on a substrate. That is, the chip is pressed onto the substrate, which distributes the conductive adhesive such that a layer of conductive particles is contained between matching bonding pads. In accordance with the invention, a compliant element is provided between the integrated circuit and the substrate which is capable of accommodating the effects of a large diameter rigid conductive ball, thereby permitting other smaller diameter balls to interconnect the opposite bonding pads.

In one embodiment of the invention, one of the sets of bonding pads is coated with a layer of a metal that is significantly softer than the metal from which the conductive particles are made. For example, the particles may be predominantly nickel, with the coating on the conductive pads being lead solder or indium. Such systems permit a significant indentation by an oversized conductive particle into the soft metal layer to permit the layer to deform around the conductive particle and thereby to contact other smaller diameter particles as well.

In another embodiment, one of the sets of bonding pads is arranged on a relatively thick layer of adhesive which is sufficiently viscous at the temperature at which contact is being made to permit the bonding pad to pivot in response to pressure from an oversized conductive particle. By providing this compliance, the bonding pad can thereby tilt to contact other smaller diameter particles as well.

These and other objects, features and benefits of the invention will be better understood from a consideration of the following detailed description taken in conjunction with the accompanying drawing.

DETAILED DESCRIPTION

Figure 1:
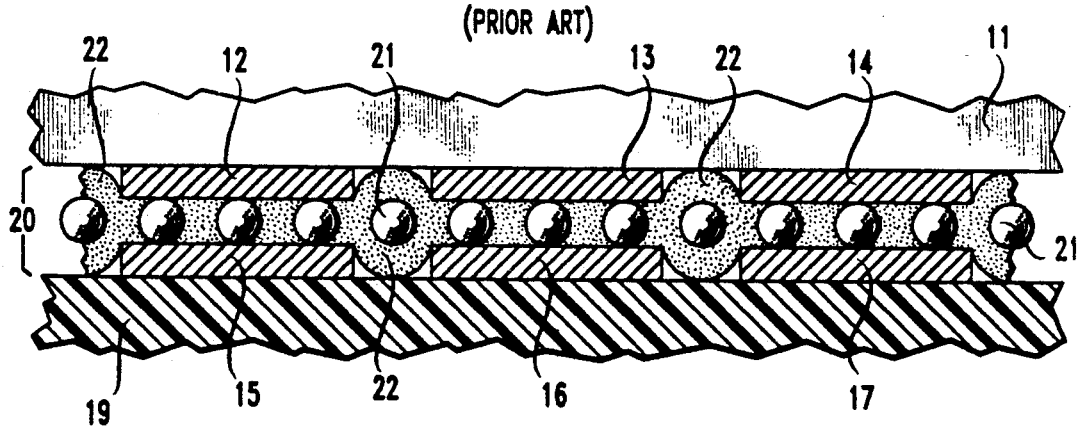
FIG. 1 is a partially sectional schematic view of a structure bonded by a conductive adhesive in accordance with the prior art.

The drawings are intended to be schematic and not to scale, and certain of the dimensions are distorted to aid in clarity of exposition. Referring now to FIG. 1, there is shown a technique for using anisotropic conductive adhesive to bond an integrated circuit chip to the conductive pattern of a substrate in accordance with the prior art. An integrated circuit chip 11 comprises a plurality of bonding pads 12, 13 and 14 which are to be permanently connected to bonding pads 15, 16 and 17 of a substrate 19. The substrate 19 may be a printed circuit to which it is desired to bond the integrated circuit 11 in accordance with the principles of flip-chip surface mounting. The bonding and interconnection is done by a conductive adhesive 20 which comprises a plurality of conductive spheres or particles 21 contained in an insulative adhesive 22.

The insulative adhesive 22 may be a polymer matrix which is applied to the substrate 19 in a fluid state, whereupon the integrated circuit 11 is pressed down in contact with it, as shown. The downward pressure causes the conductive adhesive 20, and component conductive particles 21, to distribute laterally. If the conductive particles 21 are all of the same diameter, each of the matching pairs of bonding pads will be interconnected by a plurality of the conductive particles. Thereafter, the adhesive 22 is cured by heating to become solid and to permanently bond the bonding pads 12, 13 and 14 to the matching bonding pads 15, 16 and 17. The conductive particles thereafter provide anisotropic conduction between the conductive particles. That is, they provide conduction only in the vertical direction between the matching bonding pads and do not conduct in the horizontal direction; at least they do not conduct laterally sufficiently to give short circuits between adjacent bonding pads such as bonding pads 13 and 14. The density and size of conductive particles 21 and the composition of the insulative adhesive 22 to assure anisotropic conduction in this manner is a matter which is known in the art.

One can appreciate that reducing the space between matching bonding pads such as bonding pads 12 and 15 reduces the inductances of the transmission paths provided by the particles 21. Moreover, as the size of the bonding pad is reduced to accommodate greater conductor density and microminiaturization of the integrated circuit, the size of the particles 21 must necessarily become smaller. For example, conductive particles having a nominal diameter of fourteen microns are appropriate for interconnecting matching bonding pads having a separation on the order of fourteen microns. For this purpose, solid metal balls of nickel coated with silver have been found to be appropriately conductive to be capable of transmitting relatively high current densities with relatively low inductance. A problem is that commercially available conductive balls of this size do not have the uniformly consistent diameter depicted in FIG. 1, and therefore occasionally a conductive particle 21 which is oversized can prevent the matching conducting pads from contacting other particles to provide parallel conductive paths between the bonding pads. Occasionally, such an oversized particle will cause the rigid integrated circuit chip 11 to be spaced so far from substrate 19, which may be rigid printed wiring board, that another matching pair of bonding pads cannot be interconnected by even a single particle, which is typically a catastrophic problem.

Figure 2:
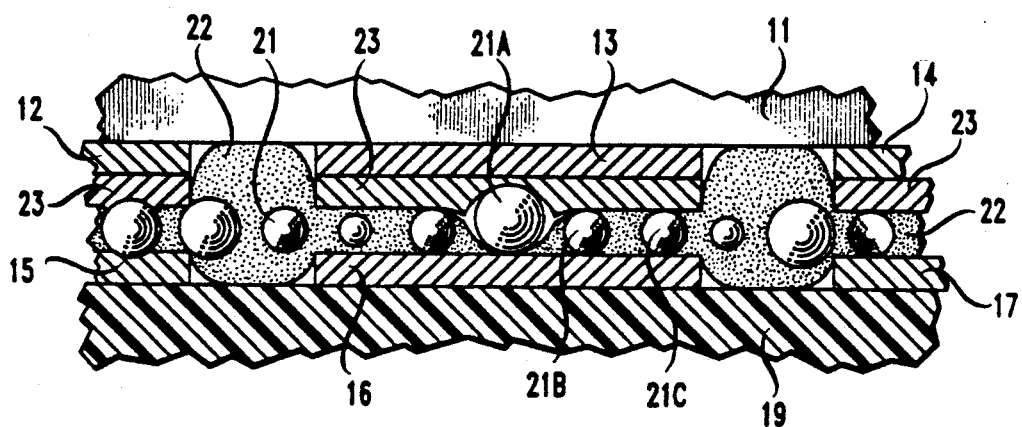
FIG. 2 is a partially sectional schematic view of a bonded structure in accordance with one embodiment of the invention.

Referring to FIG. 2, there is shown an assemblage in which elements having the same function as those of FIG. 1 have the same reference numbers. In accordance with this embodiment, all of the bonding pads of the integrated circuit 11 are coated with a layer 23 of a soft metal such as indium or solder. These layers are capable of deforming when pressed against the rigid conductive particles 21. Thus, for example, the layer 23 may be of solder which deforms to conform to the outer diameter of an oversized conductive particle 21A. This deforming permits the layer 23 to make contact with other conductive particles 21 such as particles 21B and 21C which each have a significantly smaller diameter than that of 21A. Even more importantly, the deformability of the solder layer 23 permits other bonding pads of integrated circuit chip 11 to be sufficiently closely spaced to the bonding pads of substrate 19 to make contact by way of particles 21 as shown in FIG. 1.

The embodiment of FIG. 2 was made by using as the insulator adhesive 22 one part by weight of butylated urea formaldehyde resin (solids) to three parts by weight of phenoxy resin (solids). The conductive particles were silver clad nickel spheres having a nominal diameter of fourteen microns, available from Potters Industries, Parsipanny, N.J.; however, actual diameters varied between about eight and twenty microns. The integrated circuit chip had ninety-six conductive pads 12 arranged in four rows of twenty-four pads to each row. The chip size was 0.350 inch by 0.350 inch. The bonding pads were each one hundred microns on a side, and the separation between the bonding pads 12 and 15 was fourteen microns. The layers 23 were thirty microns thick and made of a solder of ninety-five percent lead and five percent tin, which solder has a melting temperature of three hundred twenty degrees Centigrade. The solder was applied by evaporation in a known manner. The bonding temperature was between one hundred thirty and one hundred fifty degrees Centigrade at which temperature the adhesive 22 flowed under pressure. The bonding was made by applying a downward force on integrated circuit chip 11 which translated as a pressure of forty to fifty pound per square inch on each of the bonding pads 23. The integrated circuit chip had a maximum current rating of fifty milliamperes, and such current was transmitted reliably by the anisotropic interconnection. Experiments with metal coated polymer spheres used as the particles 21 showed a tendency of the metal coatings to burn out at five to ten milliamps.

Figure 3:
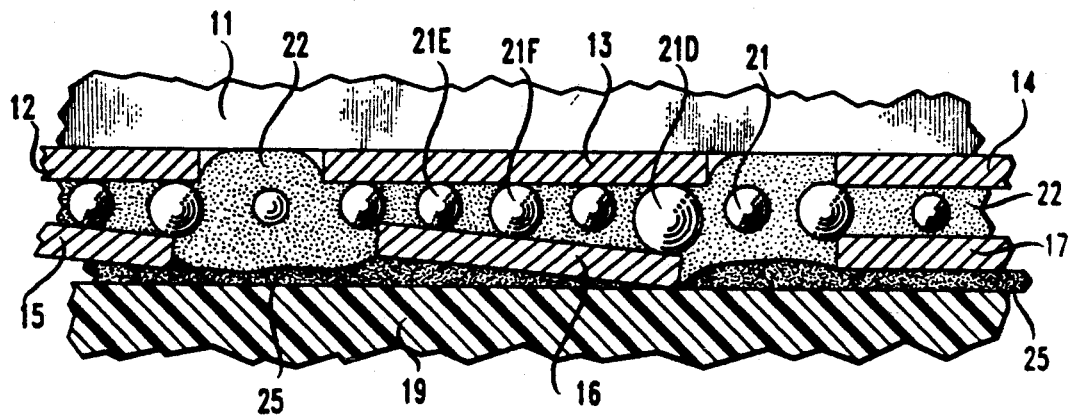
FIG. 3 is a schematic partially sectional view of a bonded structure in accordance with another embodiment of the invention.

Referring to FIG. 3, there is shown another embodiment in which elements having the same function as elements of FIG. 1 have the same reference numbers. In accordance with this embodiment, the bonding pads 15, 16 and 17 (and the conductive pattern of which they are a part) are separated from the substrate 19 by an adhesive layer 25. The adhesive layer 25 is sufficiently compliant at the bonding temperature to permit bonding pad 16, for example, to pivot in response to downward pressure from an oversized particle 21D. Because of this compliance, the bonding pad is capable of making contact with particles 21E and 21F even though these particles may each have a significantly smaller diameter than that of particle 21D. Again, despite the presence of an oversized particle, the appropriate spacing between the chip 11 and the substrate 19 is allowed to be maintained, as required for giving suitable contact between other matching pairs of electrodes, and a plurality of contacts is made between the bonding pads 13 and 16. The adhesive 25 is preferably a polymer that can be cured to harden it after bonding.

An acrylic adhesive, available from the E. I. DuPont Company of Wilmington, Del., or from the 3M Company of Minneapolis, Minn., may be used as the adhesive 25; it may have a thickness of twenty-five to thirty-five microns to be consistent with the dimensions given above. These materials give typical yield strength in polymerized form of 8–10×10³ pounds per square inch and a compressive strength of 14–18×10³ pounds per square inch which is satisfactory for the mechanical purpose of maintaining the structural configuration of the device. Again, downward pressure during the bonding step was forty to fifty pounds per square inch.

Two specific embodiments have been described in detail for providing reliable anisotropic adhesive conductor interconnects using conductive particles that vary in diameter from eight to twenty microns. These variations in diameter were successfully accommodated by the two specified varieties of compliant element located between the integrated circuit chip and the substrate. These embodiments provided effective mechanical bonding and interconnection of an integrated circuit with the conductive pattern on a substrate carrying a relatively high current density. We have found that the invention is also beneficial in that the compliant elements absorb stresses resulting from thermal mismatch, an inevitable consequence of using solid metal conductive particles at the relatively high temperatures needed for bonding and/or curing. Still another advantage of the invention is that it prevents oversized particles from penetrating through the bonding pads of the chip, which may be only one to three thousand angstroms thick, which penetration in certain devices could cause spurious short-circuits.

It should be noted that, in the embodiment of FIG. 2, the soft compliant layer 23 could be used on the substrate bonding pad 15 in lieu of, or in addition to, its use on the integrated circuit bonding pad. Likewise, in the FIG. 3 embodiment, the bonding pads of the integrated circuit could theoretically be held on an adhesive layer, although this would be much more difficult to implement than the embodiment of FIG. 3. Various other embodiments and modifications may be made by those skilled in the art without departing from the spirit and scope of the invention.

We claim:

1. A method for interconnecting first conductors of a first body to second conductors of a second body comprising the steps of:
   applying to the second conductor a conductive adhesive comprising an insulating adhesive containing rigid conductive particles of solid metal;
   locating the second body such that a plurality of the first conductors are separated by the conductive adhesive from a plurality of said second conductors;
   making part of one of the first and second conductors to be of a compliant conductive material that is sufficiently softer than the metal from which the conductive particles are made that it can be deformed around part of a conductive particle during a pressing step;
   the conductive particles comprising nickel, and the compliant material being selected from the group consisting of indium and lead/tin solder material;
   pressing the first body toward the second body to conductively interconnect first and second conductors;
   the compliant conductive material being sufficiently compliant to permit rigid conductive particles of different dimensions to contact simultaneously first and second conductors.

2. The method of claim 1 wherein:
the first body is a semiconductor integrated circuit.

3. The method of claim 1 wherein:
the conductive particles are made of nickel coated with silver.

4. An electronic device comprising;
a first body comprising first conductors;
a second body comprising second conductors;
means for interconnecting the first and second conductors comprising a conductive adhesive adhering at certain locations to both the first and second conductors;
said conductive adhesive comprising an insulative adhesive containing rigid conductive particles of solid metal;
a compliant element between the first and second bodies;
the compliant element comprises part of one of the first and second conductors and is of a compliant conductive material that is softer than the metal from which the conductive particles are made and is deformed around part of said conductive particles;
the conductive particles comprise nickel, and the compliant conductive material is selected from the group consisting of indium or lead/tin solder material;
said compliant element being sufficiently compliant to permit different rigid conductive particles of different dimensions to contact simultaneously first and second conductors.

5. The device of claim 4 wherein:
the first body is a semiconductor integrated circuit, and the second body is a rigid substrate.

6. The electronic device of claim 4 wherein:
the conductive particles are made of nickel coated with silver.

7. The electronic device of claim 6 wherein:
the conductive particles are made predominantly of nickel, and the outer portions of the first binding pads are made of a metal selected from the group consisting of indium and lead/tin solder material.

8. The electronic device of claim 7 wherein:
the conductive particles are made of nickel coated with silver.

9. An electronic device comprising:
a first body comprising first bonding pads;
a second body comprising second bonding pads, each of which match a corresponding first bonding pad;
means for interconnecting matching first and second bonding pads comprising a conductive adhesive interconnecting and bonding such matching bonding pads;
said conductive adhesive comprising an insulative adhesive containing conductive particles of solid metal, at least one of the particles having a diameter larger than others of said particles;
said particles having an average diameter of less than twenty microns;
the first bonding pads comprising an outer portion of a compliant metal that is significantly softer than the metal from which the rigid conductive particles are made;
at least certain of the large diameter particles significantly indenting into the compliant metal outer portion of certain of said first bonding pads, said indentation causing such outer portions to deform around each of said large diameter conductive particles sufficiently to permit such outer portion to contact smaller diameter particles;

said particles defining a plurality of conductive paths between the first and second bonding pads, all of said conductive paths consisting solely of relatively low resistance metal conductive path portions.

10. The electronic device of claim 9 wherein: the first bonding pad comprises an inner portion of a metal that is significantly harder than said compliant metal.

11. The electronic device of claim 10 wherein: the first body comprises an integrated circuit; and the inner layers of the first bonding pads are one thousand to three thousand angstroms thick.

12. The electronic device of claim 9 wherein: the conductive particles have a nominal diameter of approximately fourteen microns, and the separation of the first and second bonding pads is approximately fourteen microns.

* * * * *